(12) United States Patent
Khan et al.

(10) Patent No.: US 7,838,383 B2
(45) Date of Patent: Nov. 23, 2010

(54) METHODS FOR FORMING MOS CAPACITORS

(75) Inventors: Tahir A. Khan, Tempe, AZ (US); Amitava Bose, Tempe, AZ (US); Vishnu K. Khemka, Phoenix, AZ (US); Ronghua Zhu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 217 days.

(21) Appl. No.: 11/969,600

(22) Filed: Jan. 4, 2008

(65) Prior Publication Data
US 2009/0174030 A1     Jul. 9, 2009

(51) Int. Cl.
*H01L 29/72* (2006.01)

(52) U.S. Cl. .............. 438/395; 438/210; 438/239; 257/296; 257/532

(58) Field of Classification Search .......... 438/210, 438/239, 395; 257/296, 532
See application file for complete search history.

(56) References Cited

U.S. PATENT DOCUMENTS

| | | | |
|---|---|---|---|
| 4,878,151 A | 10/1989 | Gallichio | |
| 5,341,009 A * | 8/1994 | Young et al. | 257/296 |
| 5,793,074 A * | 8/1998 | Choi et al. | 257/296 |
| 5,801,411 A | 9/1998 | Klughart | |
| 6,074,907 A | 6/2000 | Oh et al. | |
| 6,495,416 B1 | 12/2002 | Ito et al. | |
| 7,110,718 B1 | 9/2006 | Szczeszynski et al. | |
| 2009/0283859 A1 * | 11/2009 | Esmark et al. | 257/532 |

OTHER PUBLICATIONS

St. Onge, S.,et al., Design of Precision Capacitors for Analog Applications, IEEE Transactions of Components, Hybrids, and Manufacturing Technology, vol. 15. No. 6, Dec. 1992.

\* cited by examiner

*Primary Examiner*—Edward Wojciechowicz
(74) *Attorney, Agent, or Firm*—Ingrassia, Fisher & Lorenz, P.C.

(57) ABSTRACT

Method (200) and apparatus (30, 50-53) are described for MOS capacitors (MOS CAPs). The apparatus (30, 50-53) comprises a substrate (31) having Ohmically coupled N and P semiconductor regions (32, 34; 54, 56; 92, 94) covered by a dielectric (35, 57, 95). A conductive electrode (36, 58, 96) overlies the dielectric (35, 57, 95) above these N and P regions (32, 34; 54, 56; 92, 94). Use of the Ohmically coupled N and P regions (32, 34; 54, 56; 92, 94) substantially reduces the variation (40, 64, 70, 80) of capacitance with applied voltage associated with ordinary MOS CAPs. When these N and P regions (32, 34; 54, 56; 92, 94) have unequal doping, the capacitance variation (40, 64, 70, 80) may still be substantially compensated by adjusting the properties of the dielectric (57, 95) above the N and P regions (54, 56; 92, 94) and/or relative areas of the N and P regions (54, 56; 92, 94) or both. Accordingly, such MOS CAPS may be more easily integrated with other semiconductor devices with minimal or no disturbance to the established integrated circuit (IC) manufacturing process and without significantly increasing the occupied area beyond that required for a conventional MOS CAP.

20 Claims, 9 Drawing Sheets

US 7,838,383 B2

METHODS FOR FORMING MOS CAPACITORS

TECHNICAL FIELD

The present invention generally relates to integrated semiconductor devices and circuits, and more particularly relates to structure and method for integrated metal-oxide-semiconductor (MOS) capacitors having improved voltage linearity.

BACKGROUND

Semiconductor (SC) devices and integrated circuits (ICs) often make use of integrated capacitors formed between a conductive electrode separated from the semiconductor by a thin dielectric. These are customarily referred to as a metal-oxide-semiconductor (MOS) capacitor or by the abbreviation MOS CAP. Integrated MOS capacitor 20 is shown in FIG. 1 where P or N semiconductor substrate 21 (e.g., silicon) usually has therein N or P well 22 extending to surface 23 on which is provided dielectric layer 24 (e.g., $SiO_2$) surmounted by conductive electrode 25, e.g., a metal or highly doped semiconductor. Dielectric regions 26, 27 (e.g., $SiO_2$) are typically also provided to facilitate lateral isolation of MOS capacitor 20 from other devices and contacts being integrated on SC substrate 21. Highly doped region 28 of the same conductivity type as N or P well 22 is provided for making a low resistance connection to N or P well 22 and terminals 29-1, 29-2 (collectively 29) are coupled to region 28 and overlying electrode 25 so that voltage $V_c$ can be applied to MOS capacitor 20. Dielectric 24 is often formed from an oxide, e.g., $SiO_2$, but that is not essential. Other dielectric materials can also be used. It is customary to refer to this structure as a metal-oxide-semiconductor (MOS) capacitor and by the abbreviation MOS CAP, even when insulating materials other than oxide are used as the dielectric. This convention is followed herein keeping in mind that the word "oxide" is intended to include dielectrics of any insulating material and not be limited merely to compounds containing oxygen. MOS CAP 20 differs from a conventional MOS transistor in that there are no source and drain regions and no lateral current flow in SC region 22 beneath electrode 25.

Because semiconductor N or P well 22 forms one electrode of MOS CAP 20, the capacitance provided by MOS CAP 20 will in general depend upon the applied voltage $V_c$. Thus, MOS CAP 20 is said to be "non-linear" in the sense that its capacitance is influenced the applied voltage $V_c$. This effect is well known in the art. Such non-linearity is often a source of problems in integrated circuit design using MOS CAPs. The voltage dependent capacitance of such structures can make it very difficult to maintain the desired circuit properties as the circuit voltage varies. Such voltage dependent capacitance can be avoided by using only metal electrodes and interlayer dielectrics for the capacitors, that is, by not using a semiconductor as one plate of the capacitor. However, this approach usually results in a more complex manufacturing processes and larger occupied integrated circuit area, resulting in higher manufacturing cost. Various other approaches have been tried in the prior art for reducing the voltage dependence of MOS CAPs, but none have been entirely successful or have required processing steps not normally included in the manufacturing sequence for the other devices in the associated integrated circuit (IC) or have required processing steps that can interfere with other aspects of IC manufacture. Accordingly, there is a need for improved device structures and methods of fabrication of MOS capacitors (MOS CAPs) that can substantially mitigate or eliminate their voltage sensitivity, i.e., reduce their voltage non-linearity, without a significant increase in occupied area and/or manufacturing process complexity, or adverse process interactions.

BRIEF DESCRIPTION OF THE DRAWINGS

The present invention will hereinafter be described in conjunction with the following drawing figures, wherein like numerals denote like elements.

DETAILED DESCRIPTION

Figure 1:
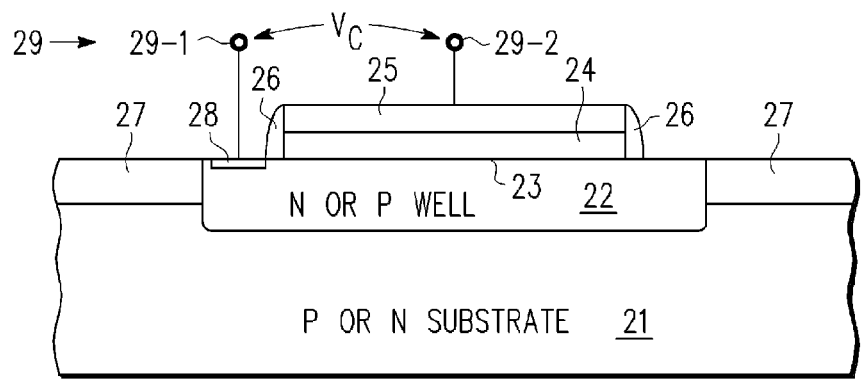
FIG. 1 is a simplified schematic cross-sectional view through a MOS CAP according to the prior art.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction and method of fabrication, and descriptions and details of well-known features and techniques may be omitted to avoid unnecessarily obscuring the invention. Additionally, elements in the drawings figures are not necessarily drawn to scale. For example, the dimensions of some of the elements or regions in some of the figures may be exaggerated relative to other elements or regions of the same or other figures to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. It is to be understood that the embodiments of the invention described herein may be used, for example, in other orientations than those illustrated or otherwise described herein. The term "coupled," as used herein, is defined as directly or indirectly connected in an electrical or non-electrical manner.

The various embodiments described herein illustrate improved MOS CAP structures and methods for use in integrated circuits or discrete devices. They have the advantage that the methods, materials and structures employed are compatible with present day manufacturing capabilities and materials, and do not require substantial modifications of available manufacturing procedures or significant increase in occupied area or other increase in manufacturing costs. Furthermore, other desirable features and advantages of the present invention will become apparent from the subsequent detailed description and the appended claims, taken in conjunction with the accompanying drawings and the foregoing technical field and background.

For convenience of explanation and not intended to be limiting, various embodiments are described for MOS CAPs formed using silicon semiconductor material as a monolithic substrate, but this is not essential and the principles taught herein apply to a wide variety of semiconductor materials and other substrates. Non-limiting examples of other suitable semiconductor materials are: various other type IV, III-V and II-VI compounds and mixtures thereof and organic semiconductors. Accordingly, while silicon is identified a suitable semiconductor material and is assumed for convenience of explanation to also serve as the supporting substrate, the various embodiments described herein are not limited thereto. For example, other semiconductors such as those noted above may be used and such semiconductor need not also serve as the supporting substrate. Silicon-on-sapphire or other dielectric is a non-limiting example of the semiconductor being provided on an insulating substrate. Other types of insulating substrates may also be used in conjunction with various semiconductors. For convenience of explanation and not intended to be limiting, various N and P-type regions are referred to herein as N-wells and P-wells even though such N and P-type regions need not be within a semiconductor substrate. Hence, the terms "N-well" and "P-well," singular or plural, in reference to various semiconductor regions are intended to include topography where such N and P-type regions are formed on the surface of rather than in or within a supporting substrate. Similarly, for convenience of explanation and not intended to be limiting, the dielectric layers and regions are illustrated herein in terms of silicon oxide, e.g., $SiO_2$ and/or $SiO_x$, but it will be understood that any suitable dielectric material may be used for such layers and regions. Non-limiting examples of such other dielectric materials are nitrides, oxy-nitrides, fluorides, organic materials, and various mixtures thereof with and without oxides.

Figure 2:
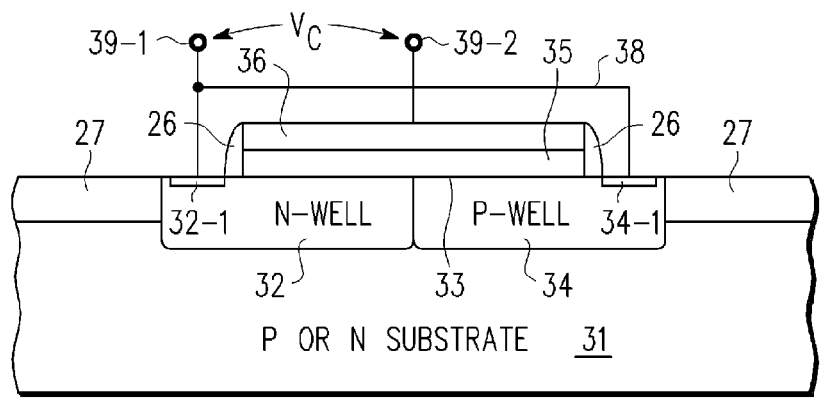
FIG. 2 is a simplified schematic cross-sectional view through a MOS CAP according to an embodiment of the present invention.

FIG. 2 is a simplified schematic cross-sectional view through MOS CAP 30 according to an embodiment of the present invention. MOS CAP 30 comprises P or N type semiconductor (SC) substrate 31, N-well 32 and P-well 34, both extending to upper SC surface 33. Dielectric layer 35 is provided on SC surface 33 above N and P-wells 32, 34. Electrode 36 overlies dielectric layer 35 and is insulated from SC substrate 31 and N and P-wells 32, 34 by dielectric 35. N-well 32 and P-well 34 are depicted as being adjacent, as actually touching in this example, but that is not essential. It is desirable for chip layout economy that the total area occupied by the MOS CAP be as small as possible, therefore having adjacent N and P-wells or even touching N and P-wells is usually desirable, but not essential. If for other reasons, it is desirable to separate the N and P-wells so that they are not touching, this may be done according to further embodiments. Accordingly, as used herein the word "adjacent" in describing the relative position of the N and P-wells is intended to include both N and P-wells that are touching and N and P-wells that are somewhat separated. N+ contact region 32-1 is provided in N-well 32 and P+ contact regions 34-1 is provided in P-well 34. Contact regions 32-1 and 34-1 are Ohmically coupled by lead 38 (or any other Ohmic coupling) and connected to terminal 39-1. Terminal 39-2 is Ohmically coupled to capacitor (upper) electrode 36. Voltage $V_c$ is applied to MOS CAP 30 via terminals 39-1 and 39-2. MOS CAP 30 of FIG. 2 differs from MOS CAP 20 of FIG. 1 in that, rather than a single N or P-well underlying MOS CAP electrode 25 as in FIG. 1, Ohmically coupled N and P-wells 32, 34 underlie MOS CAP electrode 36 in FIG. 2. Lateral dielectric isolation regions 26 and 27, analogous to those of FIG. 1, are conveniently but not essentially included in MOS CAP 30 of FIG. 2. In the same way as was noted in connection with MOS CAP 20 of FIG. 1, MOS CAP 30 of FIG. 2 differs from a conventional MOS transistor in that there are no source and drain regions or electrodes and no lateral current flow in SC regions 32, 34 beneath electrode 36. This is also true of the further MOS CAPs described herein. As noted on FIG. 2, substrate 31 can be either P or N-type. For convenience of description, it is assumed hereafter that substrate 31 is P-type but this is not intended to be limiting and persons of skill in the art will understand based on the description herein that the MOS CAP substrate may be P or N-type or intrinsic or formed from an insulator.

Figure 3:
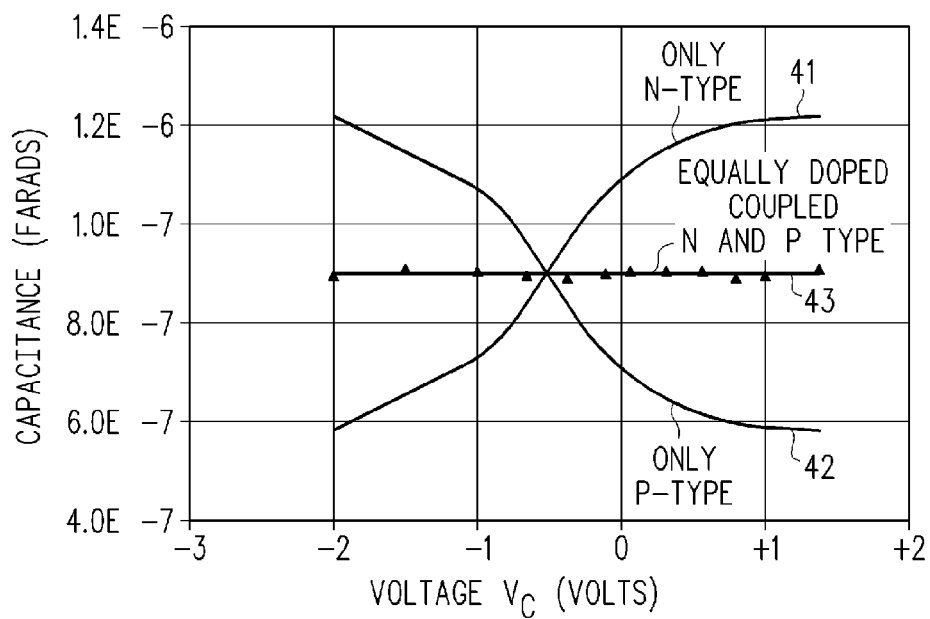
FIG. 3 is a simplified plot of capacitance in Farads as a function of applied voltage $V_c$ in volts, comparing the voltage dependent behavior of the MOS CAP structures of FIGS. 1 and 2.

FIG. 3 shows simplified plot 40 of capacitance in Farads as a function of applied voltage $V_c$ in volts, comparing the voltage dependent behavior of MOS CAP 20 of FIG. 1 to that of MOS CAP 30 of FIG. 2. In this example, MOS CAPs 20 and 30 had substantially equal P and N-well doping, e.g., about 1E19 $cm^{-3}$, and substantially equal area, that is, the P-well area ($A_P$) or the N-well area ($A_N$) of MOS CAP 20 was substantially the same as the combined P and N-well area $(A_{(P+N)})=(A_P)+(A_N)$ of MOS CAP 30. Trace 41 shows the capacitance verses voltage $V_c$ behavior of MOS CAP 20 where well 22 is N-type as indicated by the legend "ONLY N-TYPE." Trace 42 shows the capacitance verses voltage $V_c$ behavior of MOS CAP 20 where well 22 is P-type, as indicated by the legend "ONLY P-TYPE.". Trace 43 shows the capacitance verses voltage $V_c$ behavior of MOS CAP 30 wherein both N-well 32 and P-well 34 are present, substantially equally doped and Ohmically coupled. It will be noted that the voltage dependence of the capacitance has been substantially eliminated by the use of the combination of substantially equally doped Ohmically coupled P-type and N-type wells in MOS CAP 30. This is a significant improvement over the prior art. There is little or no area penalty since the occupied areas are substantially the same and little or no process penalty where comparable N and P-type doping steps are available in the overall manufacturing process.

Figure 4:
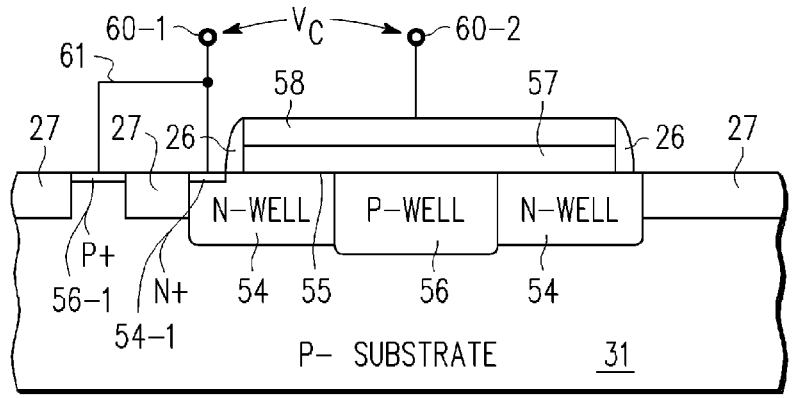
FIG. 4 is a simplified cross-sectional view through a MOS CAP according to a further embodiment of the present invention.

FIG. 4 is a simplified cross-sectional view through MOS CAP 50 according to a further embodiment of the present invention. MOS CAP 50 comprises P-type SC substrate 31 analogous to substrates 21, 31 of FIGS. 1 and 2, and N-well 54 and P-well 56 extending to upper SC surface 55. Dielectric layer 57 is provided on SC surface 55 above N and P-wells 54, 56. Electrode 58 overlies dielectric layer 57. Electrode 58 is insulated from SC substrate 31 and N and P-wells 54, 56 by dielectric 57. N+ contact region 54-1 is provided in N-well 54 and P+ contact regions 56-1 is provided in P-substrate 31, which is ohmically coupled through substrate 51 to P-well 56. If substrate 31 is insulating, for example, then contact region 56-1 is provided directly on P-well 56 at some location. Contact regions 54-1 and 56-1 are Ohmically coupled by lead 61 (or any other Ohmic coupling arrangement) and connected to terminal MOS CAP 60-1. MOS CAP terminal 60-2 is Ohmically coupled to upper electrode 58. Voltage $V_c$ is applied to MOS CAP 50 across terminals 60-1 and 60-2. MOS CAP 50 of FIG. 4 differs from MOS CAP 30 of FIG. 2 in that N-well 54 desirably but not essentially laterally surrounds P-well 56 rather than being side-by-side, as illustrated in FIG. 2. This can be seen more clearly in FIG. 5. Lateral dielectric isolation regions 26 and 27, analogous to those of FIGS. 1 and 2, are conveniently but not essentially included in MOS CAP 50 of FIG. 4.

Figure 5:
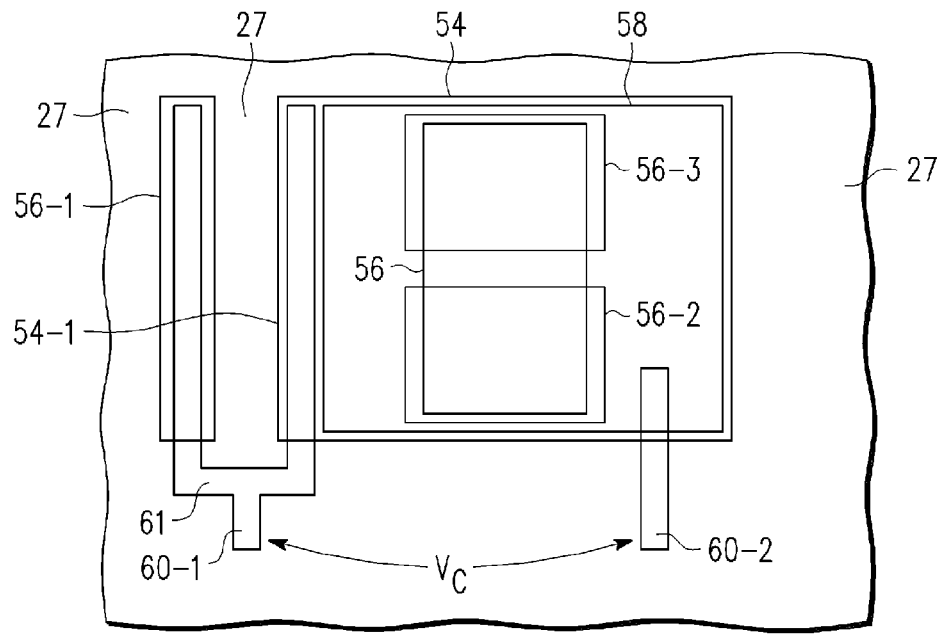
FIG. 5 is a simplified plan view of the MOS CAP of FIG. 4 showing additional details.

FIG. 5 shows simplified plan view 50' of MOS CAP 50 of FIG. 4. Upper electrode 58 substantially overlies the combination of P-well 56 and N-well 54. In the example of FIG. 5 upper electrode 58 is shown as being slightly smaller laterally than N-well 54, but this is merely to facilitate visibility of the different regions or layers and is not intended to be limiting. Upper electrode 58 may alternatively extend laterally beyond P-well 56 and N-well 54, as long as some means is provided for making Ohmic contact to such semiconductor regions. Also, P-well 56 is shown as a single region laterally enclosed within N-well 54, but this is not essential. P-well 56 may be a single well region or may be broken up into several well regions, as illustrated for example and not intended to be limiting, by P-well regions 56-2 and 56-3. Either single or multiple well arrangements are useful. Further, while P-well 56 is shown in FIGS. 4-5 as lying laterally within N-well 54 (i.e., interleaved) this is not essential and the opposite arrangement can also be used, or a side by side arrangement such as is illustrated in FIG. 2 can also be used. Either arrangement is useful.

Figure 6:
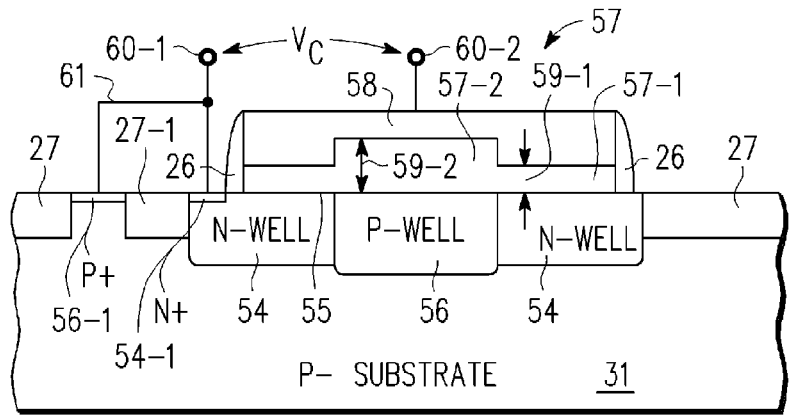
FIGS. 6-8 are simplified cross-sectional views through MOS CAPs according to still further embodiments of the present invention.
Figure 7:
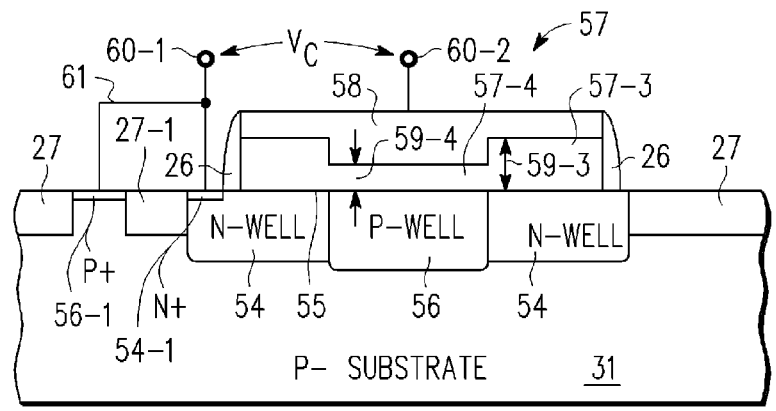
Figure 8:
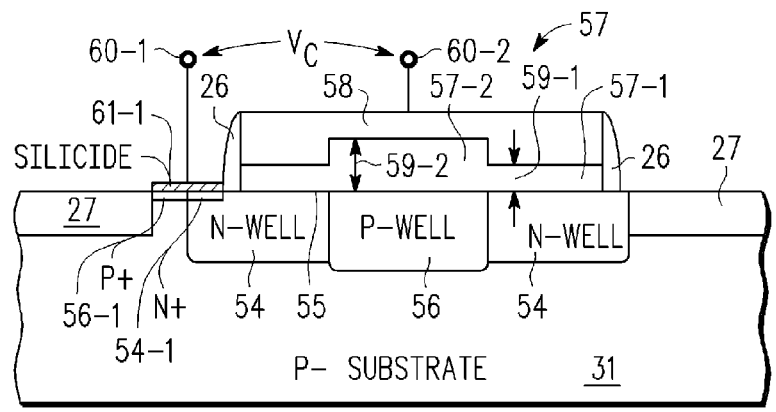

When the doping density of N-well 54 and P-well 56 are substantially the same (e.g., $1E19$ $cm^{-3}$), and the N-well area $(A_N)$ and P-well area $(A_P)$ are also substantially the same, then results comparable to that shown by trace 43 of FIG. 3 for side-by-side well regions 32, 34 of MOS CAP 30 of FIG. 2, are also obtained. However, if the process within which the MOS CAPS are intended to be integrated does not facilitate formation of substantially equally doped well regions (whether side-by-side or interleaved), then further modification of the structures illustrated in FIGS. 2 and 4 are desirable in order to minimize MOS CAP non-linearity. FIGS. 6-8 are simplified cross-sectional views through MOS CAPs 51-53 according to still further embodiments of the present invention. Like reference numbers are used to indicate like regions or layers. MOS CAP 51 of FIG. 6 and MOS CAP 52 of FIG. 7 differ from MOS CAP 50 of FIGS. 4-5 in that dielectric layer 57 is different above N-well 54 and above P-well 56, rather than being homogeneous as indicated for MOS CAP 30 of FIG. 2 and MOSCAP 50, 50' of FIGS. 4-5. In MOS CAP 51, dielectric layer or region 57-1 above N-well 54 has thickness 59-1 and dielectric layer or region 57-2 above P-well 56 has thickness 59-2. In the embodiment of MOS CAP 51 of FIG. 6, thickness 59-2 is larger than thickness 59-1. In the embodiment of MOS CAP 52 of FIG. 7, dielectric layer or region 57-3 above N-well 54 has thickness 59-3 and dielectric layer or region 57-4 above P-well region 56 has thickness 59-4, where thickness 59-3 is larger than thickness 59-4.

Which arrangement (e.g., MOS CAP 51 or 52) should be used depends upon the relative doping of N-well 54 and P-well 56. For example, if the dopant concentration $C_N$ of N-well 54 is larger than the dopant concentration $C_P$ of P-well 56, that is, $C_N > C_P$ and typically $C_N \gg C_P$, then dielectric thickness $(DT_P)$ 59-2 above P-well 56 should be larger than dielectric thickness $(DT_N)$ 59-1 above N-well 54, as shown for example with MOS CAP 51 of FIG. 6. Conversely, if the dopant concentration $C_P$ of P-well 56 is larger than the dopant concentration $C_N$ of N-well 54, that is, $C_P > C_N$ and typically $C_P \gg C_N$, then dielectric thickness $(DT_N)$ 59-3 above N-well 54 should be thicker than dielectric thickness $(DT_P)$ 59-4 above P-well 56, as shown for example with MOS CAP 52 of FIG. 7.

While the adverse effect on linearity of differing dopant concentrations can be partially or wholly compensated by adjusting the dielectric thickness above the N and P-wells, any other arrangement for separately influencing the capacitance per unit area above the N and P-wells can also be used. For example, and not intended to be limiting, reducing the dielectric constant of dielectric regions 57-1 of FIG. 6 or 57-3 of FIG. 7 can achieve the same effect as increasing dielectric thickness 59-2 of FIG. 6 or 59-3 of FIG. 7. Analogous relationships apply when the N and P-wells have different doping. For example, if the dopant concentration $C_N$ of N-well 54 is larger than the dopant concentration $C_P$ of P-well 56, that is, $C_N > C_P$ and typically $C_N \gg C_P$, then for the same dielectric thickness $(DT_P)$ of dielectric region 57-2 and dielectric thickness $(DT_N)$ of region 57-1, that is, $(DT_P) = (DT_N)$, the dielectric constant of dielectric region 57-2 of FIG. 6 should be reduced compared to that of region 57-1. Conversely, if the dopant concentration $C_P$ of P-well 56 is larger than the dopant concentration $C_N$ of N-well 54, that is, $C_P > C_N$ and typically $C_P \gg C_N$, then for the same dielectric thickness $(DT_P)$ of dielectric region 57-4 and dielectric thickness $(DT_N)$ of region 57-3, that is $(DT_P) = (DT_N)$, the dielectric constant of dielectric region 57-3 of FIG. 7 should be reduced compared to that of region 57-4. Both arrangements are useful, and a combination of differences in dielectric thickness and differences in dielectric constant may also be used. Using differences in dielectric thickness may be easier to implement in an already established manufacturing process that does not already include forming dielectrics of different dielectric constants. The converse may be true if the manufacturing process into which the MOS CAPs are being integrated already includes such capability. Stated another way, when unequal doping levels are present, then for $C_N > C_P$, the capacitance per unit area $(C/A)_P$ above P-well 56 should be less than the capacitance per unit area $(C/A)_N$ above N-well 54, that is $(C/A)_P < (C/A)_N$. Conversely, for $C_N < C_P$, it is desirable that $(C/A)_P > (C/A)_N$.

FIG. 8 is simplified cross-sectional views through MOS CAP 53, analogous to MOS CAP 51 of FIG. 6, but according to a yet further embodiment of the present invention. MOS CAP 53 differs from MOS CAP 51 in the arrangement for making Ohmic contact to the N and P-wells. In MOS CAP 53, lateral dielectric isolation region 27-1 of FIGS. 6-7 is omitted and P+ contact region 56-1 is located adjacent or close to N+ contact region 54-1 and the P+ and N+ contact regions are bridged by an Ohmic contact, as for example, silicide region 61-1. This arrangement provides a convenient means of Ohmically connecting the N and P wells.

Figure 9:
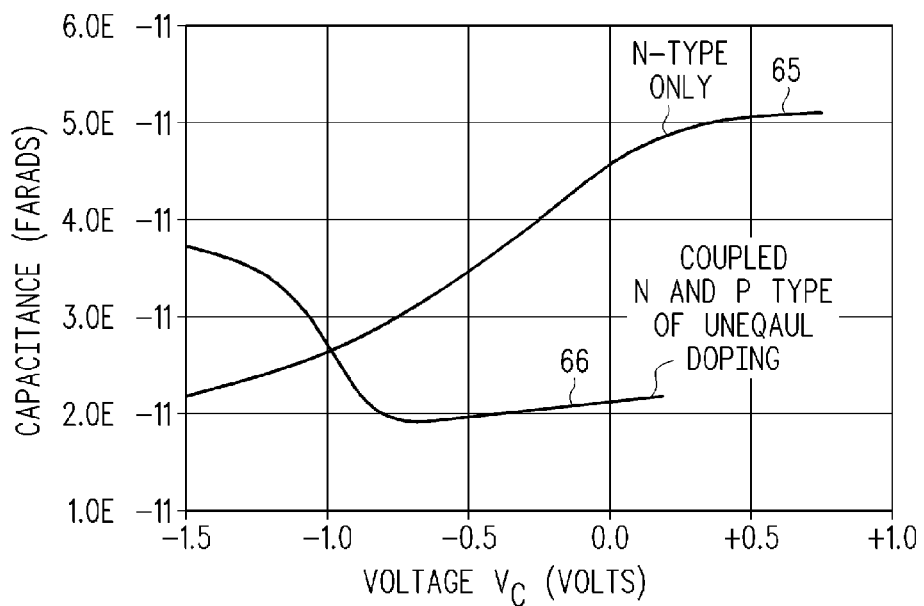
FIG. 9 is a simplified plot of capacitance in Farads as a function of applied voltage $V_c$ in volts, comparing the voltage dependent behavior of MOS CAP structures of FIGS. 1 and 4 having the same electrode area but where the N and P wells of FIG. 4 are unequally doped.

FIG. 9 shows simplified plot 64 of capacitance in Farads as a function of applied voltage $V_c$ in volts comparing the voltage dependent behavior of MOS CAP structures of FIGS. 1 and 4 having the same electrode area, but where the N and P-wells of FIG. 4 are unequally doped. In this test, N-well 22 of FIG. 1 and N-well 54 of FIG. 4 were doped to about 1E19 cm$^{-3}$, and P-well 56 was doped to about 5E17 cm$^{-3}$. The total areas were substantially the same, that is, $A_N$ of MOS CAP 20 of FIG. 1 was substantially the same as $A_{(N+P)}$ of MOS CAP 50 of FIG. 4. Trace 65 with the legend "N-TYPE ONLY" shows the C verses V behavior of MOS CAP 20 where well 22 is N-type, and trace 66 shows the C versus V behavior of MOS CAP 50 with unequally doped N-well 54 and P-well 56, as indicated by the legend "COUPLED N & P-TYPE OF UNEQUAL DOPING.". It will be noted that, even with unequal doping of the coupled N and P wells of MOS CAP 50, the MOS CAP non-linearity is reduced compared to a MOS CAP of the same area with only a single conductivity type well.

Figure 10:
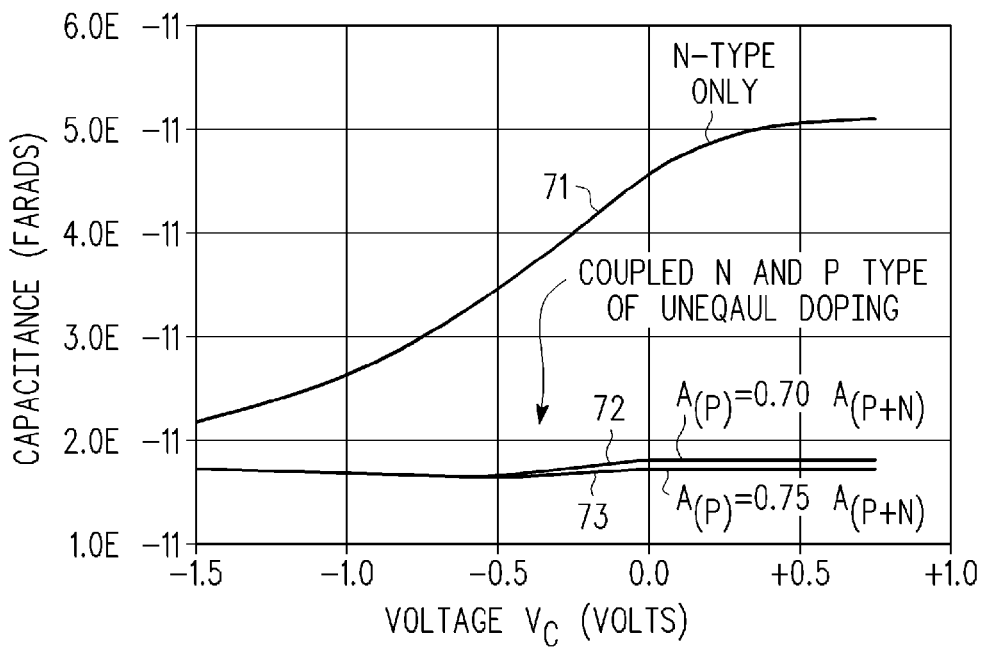
FIG. 10 is a simplified plot of capacitance in Farads as a function of applied voltage $V_c$ in volts, comparing the voltage dependent behavior of MOS CAP structures of FIGS. 1 and 6 having the same electrode area but where the dielectric thickness in the structure of FIG. 6 over the N and P wells is different, and the N and P wells are unequally doped and of different area.

FIG. 10 is simplified plot 70 of capacitance in Farads as a function of applied voltage $V_c$ in volts comparing the voltage dependent behavior of MOS CAP 20 of FIG. 1 and MOS CAP 51 of FIG. 6 having the same electrode area but where the dielectric thickness in the structure of FIG. 6 over the N and P wells is different, and the N and P wells are unequally doped and of different area. For this test, N-well 22 of MOS CAP 20 of FIG. 1 and N-well 54 of MOS CAP 51 of FIG. 6 were doped to about $C_N$~1E19 cm$^{-3}$. P-well 56 of MOS CAP 51 was doped to about $C_P$~5E17 cm$^{-3}$, that is, the relative dopant concentration levels were about $(C_N)/(C_P)$=(1E19/5E17)~20 to 1. The total MOS CAP areas were substantially the same, that is, $A_N$ of MOS CAP 20 of FIG. 1 was substantially the same as $A_{(N+P)}$ of MOS CAP 51 of FIG. 6. However, the relative N and P well areas and relative dielectric thicknesses of MOS CAP 51 were unequal. In this test, dielectric thickness ($DT_N$) 59-1 over N-well 54 was about 27 Angstrom Units and dielectric thickness ($DT_P$) 59-2 over P-well 56 was about 110 Angstrom Units, that is $(DT_P)/(DT_N)$~(110)/(27)~4 to 1. Trace 71 shows the capacitance verses voltage behavior of MOS CAP 20 of FIG. 1. Trace 72 shows the capacitance verses voltage behavior for MOS CAP 51 of FIG. 6 where the area $A_P$ of P-well 56 of MOS CAP 51 was about 70 percent of the total area of MOS CAP 51, that is, $A_P$~0.70 $A_{(P+N)}$. Trace 73 shows the capacitance verses voltage behavior for MOS CAP 51 of FIG. 6 where the area $A_P$ of P-well 56 of MOS CAP 51 was about 75 percent of the total area of MOS CAP 51, that is, $A_P$~0.75$A_{(P+N)}$, and the dielectric thicknesses were also unequal, as described above. It will be noted that the MOS CAP variation with voltage has been reduced from about 33% to less than 5% even though the dopant concentrations of the N and P wells are unequal. This is a significant improvement over the prior art and demonstrates that even when unequal P and N well doping concentrations arise from building a MOS CAP structure using an established manufacturing process that does not include equal N and P doping steps, the MOS CAP non-linearity call still be substantially eliminated.

Figure 11:
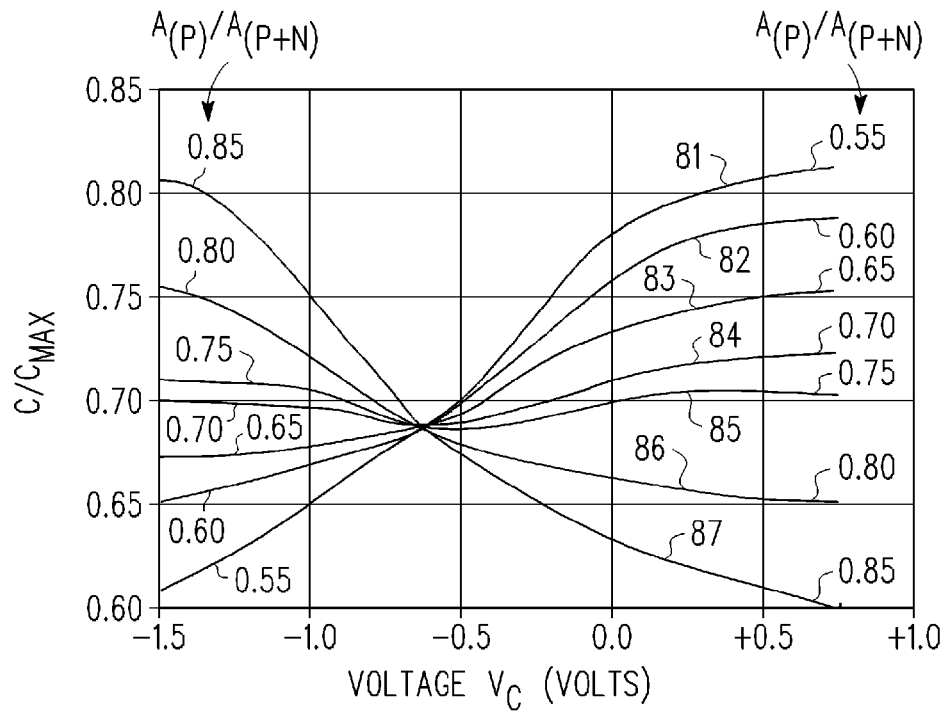
FIG. 11 is a simplified plot of normalized capacitance as a function of applied voltage $V_c$ in volts of the MOS CAP structure of FIG. 6 for different ratios of P-well area ($A_P$) to the sum of the P well area ($A_P$) plus the N-well area ($A_N$), that is, for different ratios ($A_P$)/($A_{(P+N)}$)

FIG. 11 shows simplified plot 80 of normalized capacitance as a function of applied voltage $V_c$ in volts of the structure of FIG. 6 for different ratios of P-well area $(A_P)$ to the sum of the P well area $(A_P)$ plus the N-well area $(A_n)$, that is, for different values of the ratio $[(A_P)/(A_{(P+N)})]$ where $(A_{(P+N)})=(A_P)+(A_n)$. Values of the ratio $[(A_P)/(A_{(P+N)})]$ ranged from about 0.55 to about 0.85 for traces 81 to 87. The normalized capacitance is the capacitance at a particular voltage expressed as a fraction of the maximum capacitance observed for such MOS CAPs. It will be noted that, similar to what is observed in FIG. 10, the best results (most linear MOS CAP behavior) is obtained for $[(A_P)/(A_{(P+N)})]$ equal about 0.75. Stated another way, the best results are obtained for an N and P-well area ratio $A_N$:$A_P$ of about 1:3, where the dopant concentration ratio $C_N$:$C_P$ is about 20:1 and the dielectric thickness ratio $DT_P$:$DT_N$ is about 4:1. It will be understood by those of skill in the art that different dopant concentration ratios can be compensated by adjusting the dielectric thickness ratio and the relative areas $A_P$ of P-well 56 and $A_N$ of N-well 54.

It has been found that the optimal area ratios and relative dielectric thickness for differently doped N and P wells or regions can be determined by consideration of the capacitance ratios CAPmax/CAPmin taken from capacitance (CAP) versus voltage curve of an N region of doping $C_N$ and a P region of doping $C_P$, where CAPmax is the largest capacitance value and CAPmin is the smallest capacitance value on the capacitance (CAP) versus voltage curve (e.g., analogous to curves 41 and 42 of FIG. 3). For example, and not intended to be limiting, assume that $C_N$>$C_P$ and that the smaller dielectric thickness (e.g., $DT_N$ in this case) is set by the established manufacturing process, then the larger dielectric thickness (e.g., $DT_P$ in this case) is chosen so that the ratio CAPmax/CAPmin is the same for the N region of doping concentration $C_N$ and the P regions of doping concentration $C_P$, that is, $[CAPmax/CAPmin]_N$~$[CAPmax/CAPmin]_P$ The desirable area ratio, e.g., $A_P/A_N$ can then be determined from the ratio of the maximum capacitances, $[(CAPmax)_N]/[(CAPmax)_P]$ where $(CAPmax)_N$ is the largest capacitance value obtained from the capacitance versus voltage curve over the N-type material of doping $C_N$ and $(CAPmax)_P$ is the largest capacitance value obtained from the capacitance versus voltage curve over the P-type material of doping C. Consider the following example, where $C_N$~20*$C_P$ and the dielectric thickness over the N region $DT_N$ has an electrically determined value of about 35 Angstrom Units and gives $(CAPmax)_N$~5.1 pico-Farads for a predetermined area. By measuring the capacitance versus voltage properties for dielectric layers of different thickness over a P-type region of concentration $C_P$, it is determined that the ratio CAPmax/CAPmin has substantially the same value for a dielectric thickness $DT_P$ of about 110 Angstrom Units and $(CAPmax)_P$ is about 1.7 pico-Farads for the same predetermined area. The relative N-type and P-type areas (of different doping $C_N$ and $C_P$) are then set equal to the ratio of the values of CAPmax, that is $A_P/A_N$~$[(CAPmax)_N]/[(CAPmax)_P]$. In this example then, $A_P/A_N$=$[(CAPmax)_N]/[(CAPmax)_P]$=5.1/1.7=3:1, that is about the same ratio as $DT_P/DT_N$. Stated more generally, the desirable dielectric thickness ratio $DT_P/DP_N$ over P and N-type regions of the present invention having differing doping concentrations $C_N$ and $C_P$, and the desirable area ratio $A_P/A_N$ of the P and N-type regions are obtained by satisfying the condition that the ratio CAPmax/CAPmin above the N and P-type regions (e.g., N and P-wells 32, 34 and 54, 56 and 92, 94) be substantially the same for equal area, and then using the ratio $[(CAPmax)_N]/[(CAPmax)_P]$ to set the dielectric thickness ratio $DT_P/DT_N$, and the area ratio $A_P/A_N$ where the thicker dielectric also has the largest area, that is, if $DT_P$>$DT_N$ then $A_P$>$A_N$ and vice-versa.

Figure 12:
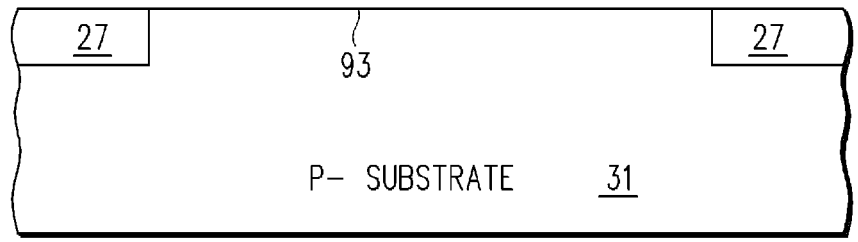
FIGS. 12-22 are simplified cross-sectional views through a MOS CAP, according to a still further embodiment of the present invention, at different stages of manufacture and showing additional details.
Figure 13:
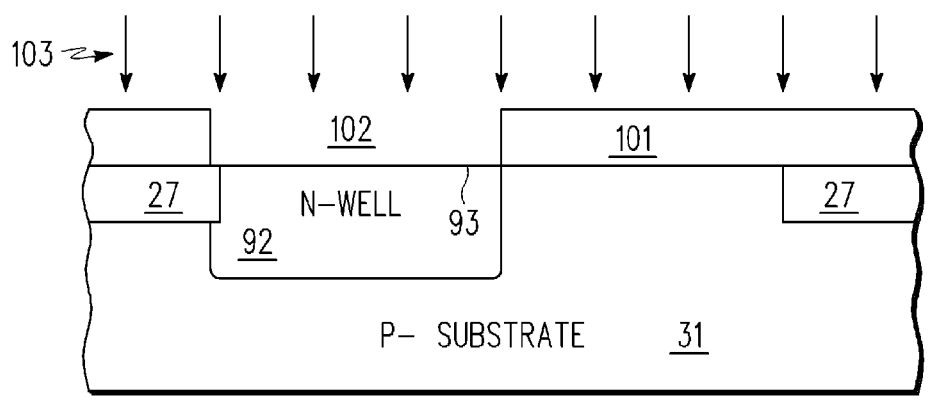

FIGS. 12-22 are simplified cross-sectional views through a MOS CAP, according to a still further embodiment of the present invention, at different stages of manufacture 90-1 through 90-11 and showing additional details. FIGS. 12-22 illustrate the manufacturing stages for forming, for example, a side-by-side MOS CAP analogous to MOSCAP 30 of FIG. 3, but with unequal dielectric thicknesses over the N and P-wells such as are illustrated in FIG. 6. Persons of skill in the art will understand based on the teachings herein that MOS CAPS 30 and 50-53 of the type illustrated in FIGS. 2 and 4-8 could equally well be formed by modification of the mask apertures used. Thus, the manufacturing stages illustrated in FIGS. 12-22 are intended to be generally representative of the method of providing MOS CAPS according to various embodiments of the present invention, wherein persons of skill in the art will understand how to adapt the process to provide N and P wells of different plan views and different modes of contact thereto. Referring now to manufacturing stage 90-1 of FIG. 12, substrate 31 having surface 93 and of, for example and not intended to be limiting, P-type silicon, is provided. In FIG. 12, conventional steps (not shown) have been used to provide lateral dielectric isolation regions 27 by means well known in the art. Structure 91-1 results. In manufacturing stage 90-2 of FIG. 13, mask 101 having opening 102 delineating the extent of N-well 92 analogous to N-wells 32 and 54 of FIGS. 2 and 6, is provided on surface 93 of substrate 31. N-well 92 is conveniently but not essentially provided by implanting N-type ions 103 through opening 102 into substrate 31. While ion implantation is preferred, any convenient doping means may be used. N-type doping in the concentration range of about 1E15 to 1E20 ions/cm$^{-3}$ is useful, with about 1E16 to 1E20 ions/cm$^{-3}$ being convenient and about 1E19 to 1E20 ions/cm$^{-3}$ being preferred. Generally, the N-well doping concentration is chosen from among those N-type doping levels already available in whatever IC manufacturing process is being used to co-fabricate the MOS CAP. Thus, larger or smaller N-type doping may also be used. Structure 91-2 results.

Figure 14:
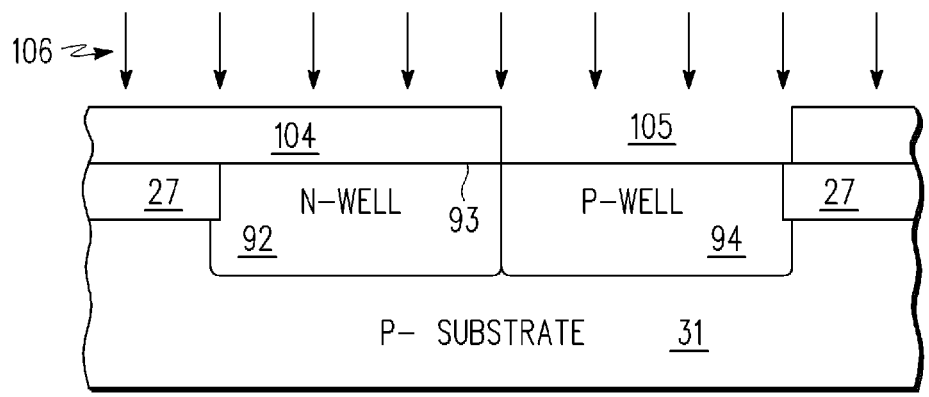
Figure 15:
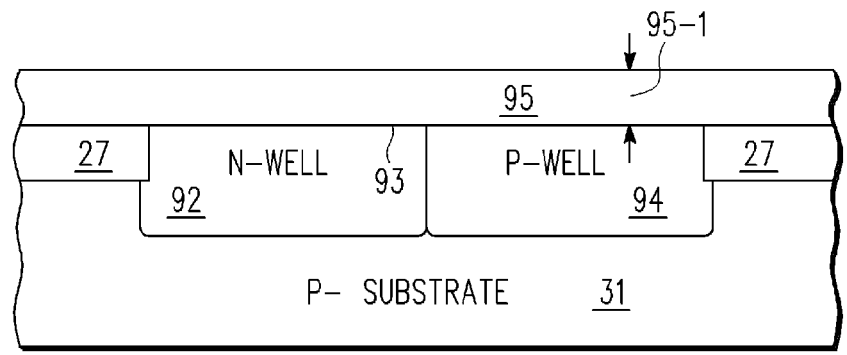
Figure 16:
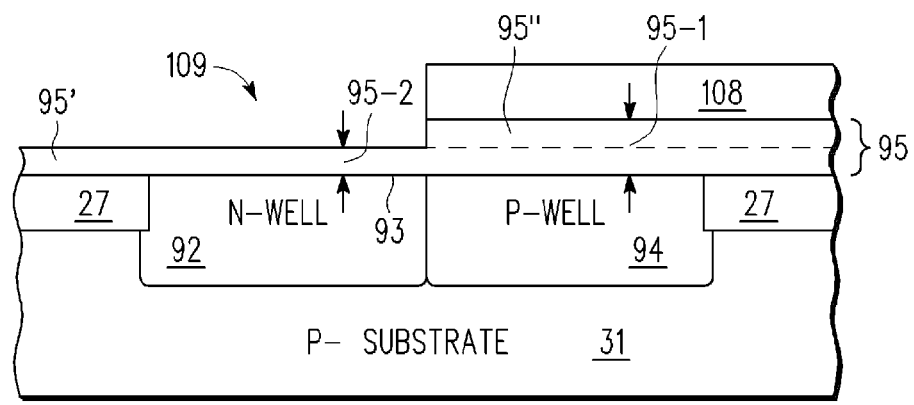

In manufacturing stage 90-3 of FIG. 14, mask 101 from stage 90-2 is removed and mask 104 is provided having opening 105 corresponding to the desired location of P-well 94 on surface 93 of substrate 31. P-type ions 106 are desirably but not essentially implanted into substrate 31 through mask opening 105, thereby forming P-well 94 analogous to P-wells 34 and 56 of FIGS. 2 and 6. While ion implantation is preferred, any convenient means of doping substrate 31 may be used to provide P-well 94. In stages 90-2 and 90-3, N and P wells 92, 94 are desirably formed to about the same depth, but this is not essential. P-type doping in the concentration range of about 1E15 to 1E20 ions/cm$^{-3}$ is useful, with about 1E16 to 1E20 ions/cm$^{-3}$ being convenient and about 1E19 to 1E20 ions/cm$^{-3}$ being preferred. Generally, the P-well doping concentration is chosen from among those P-type doping levels already available in whatever IC manufacturing process is being used to co-fabricate the MOS CAP. Thus, larger or smaller P-type doping may also be used. Structure 91-3 results. In manufacturing stage 90-4 of FIG. 15, mask 104 is removed and dielectric layer 95 (analogous to dielectric layer 35, 57 of FIGS. 2 and 6) of thickness 95-1 is formed on surface 93. Structure 91-4 results. In manufacturing stage 90-5, mask 108 with opening 109 substantially over N-well 92 is provided. Dielectric layer 95 is then etched through mask opening 109 to reduce the thickness of dielectric layer 95 overlying N-well 92 from original thickness 95-1 to smaller thickness 95-2. While it is preferred to deposit dielectric layer 95 to original thickness 95-1 and then thin the portion overlying N-well 92 to smaller thickness 95-2 this is not essential and substantially the same result can be achieved by first forming dielectric layer 95' of thickness 95-2 on surface 93, then masking the portion over N-well 92 and growing or depositing further portion 95" above P-well 94 to larger thickness 95-1. Both arrangement are useful and other procedures may also be used. What is important with the variable thickness dielectric is that the relatively thicker portion is provided over the more lightly doped of the N or P wells and the relatively thinner portion is provided over the more heavily doped of the N or P wells. Structure 91-5 results from either approach. Stated another way, as has already been discussed, other properties of the dielectric layers over the N and P wells may be modified in place of or in combination with their thickness to achieve the desired end result with or without a variable thickness dielectric. What is important is that the relative capacitance per unit area is lower over the more lightly doped of the N or P wells and the converse for the more heavily doped of the N or P wells.

Figure 17:
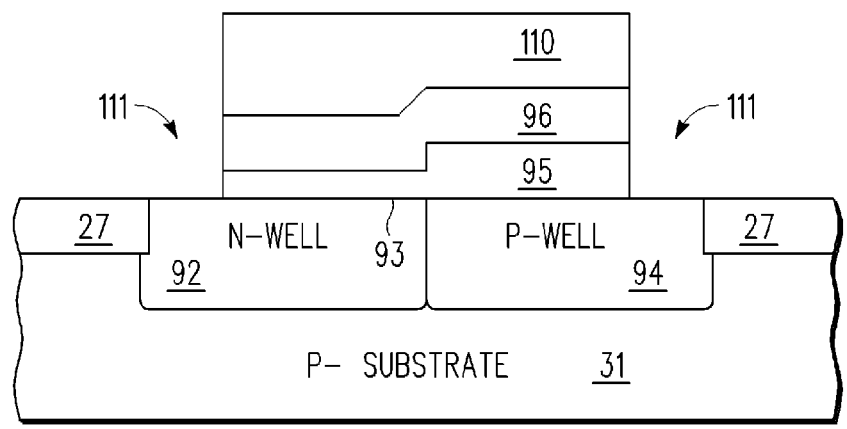
Figure 18:
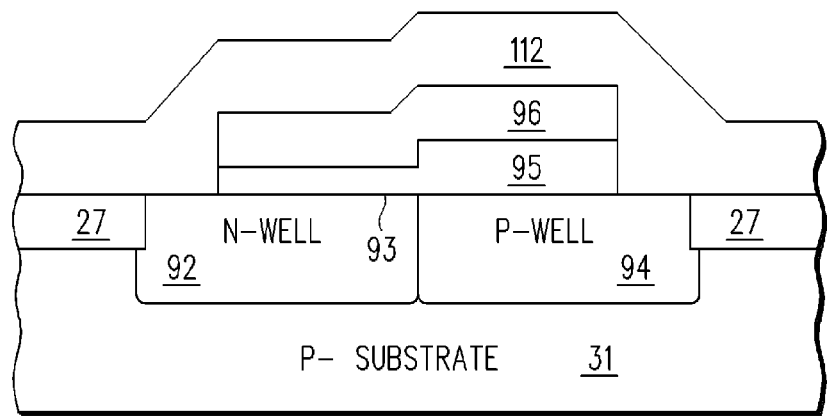
Figure 19:
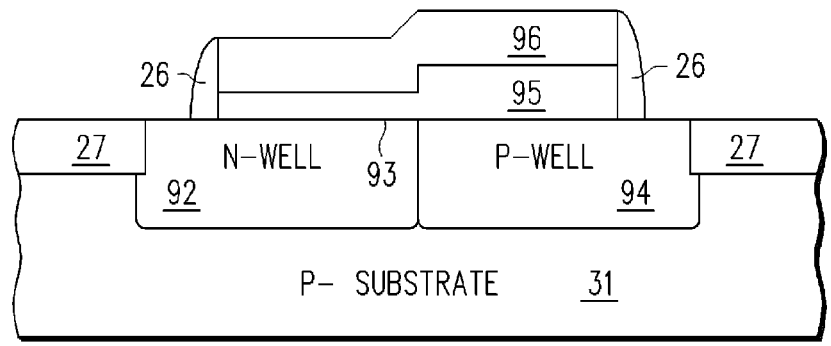
Figure 20:
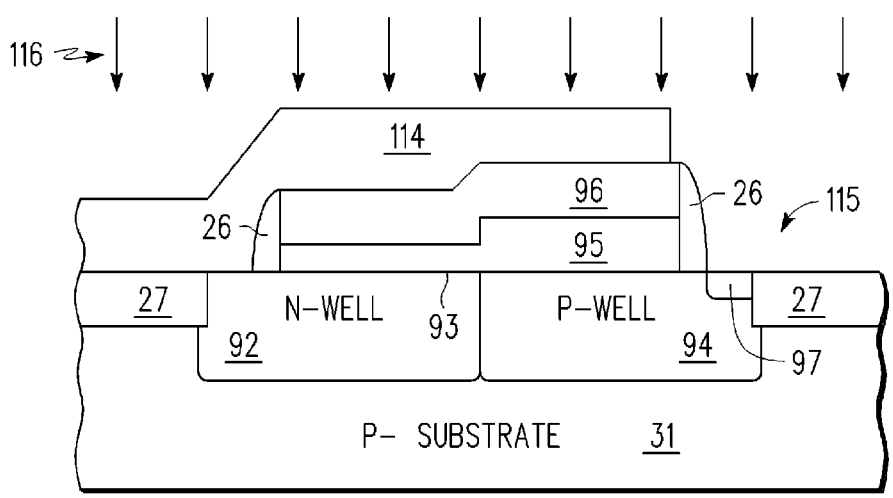
Figure 21:
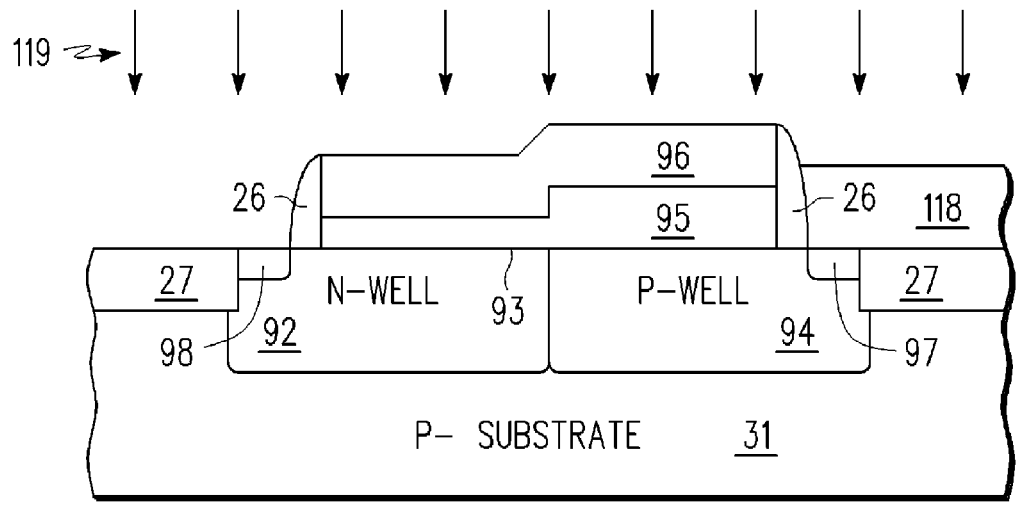

Referring now to manufacturing stage 90-6 of FIG. 17, mask 108 is removed and conductive layer 96, e.g., doped polysilicon, is applied over dielectric 95. Conductive layer 96 may be a highly doped semiconductor or a metal or semimetal and will form the upper electrode of the MOS CAP. Conductive layer 96 is covered with mask 110 having openings 111 which are used to etch though conductive layer 96 and dielectric 95 to once again expose upper surface 93 of N and P wells 92, 94 in semiconductor substrate 31. Structure 91-6 results. In manufacturing stage 90-7 of FIG. 18, mask 110 is removed and dielectric layer 112 formed overlying the remaining layers and regions of structure 91-6. Structure 91-7 results. In manufacturing stage 90-8 of FIG. 19, anisotropic etching is used to substantially remove dielectric layer 112 but leave behind lateral dielectric sidewalls 26. This type of etching to form lateral dielectric sidewalls is well known in the art. Structure 91-8 results. In manufacturing stage 90-9 of FIG. 20, mask 114 is applied with opening 115 located so as to expose a portion of P-well 94 not covered by dielectric 95 and conductive layer 96. Dopant 116 is provided, preferably but not essentially by ion implantation, to form P+ contact region 97 in P-well 94. Structure 91-9 results. In manufacturing stage 90-10 of FIG. 21, mask 114 is removed and mask 118 applied covering P+ contact region 97 and any other part of P-well 94 not already protected. N-type dopant 119 is applied, preferably but not essentially by ion implantation, to form N+ region 98 in N-well 92. Where conductive layer 96 is of, for example, polysilicon, then N-type dopant 119 is likewise implanted therein to further increase its conductivity. Structure 91-10 results. In manufacturing stage 90-11 of FIG. 22, metal or other, for example, silicide forming conductor 99 is provided to form conductor 99-1 on conductive layer 96, conductor 99-2 on P+ contact region 97 and conductor 99-3 on N+ contact region 98 to reduce the resistance thereof. At the same time or in a separate processing step, conductive interconnection 99-4 is provided to Ohmically couple N-well and P-well regions 92, 94. External connections 99-5, 99-6 are also conveniently applied in the same or separate steps, thereby forming structure 91-11. MOS CAP 100 analogous to MOS CAPS 30, 50-53 results.

Figure 22:
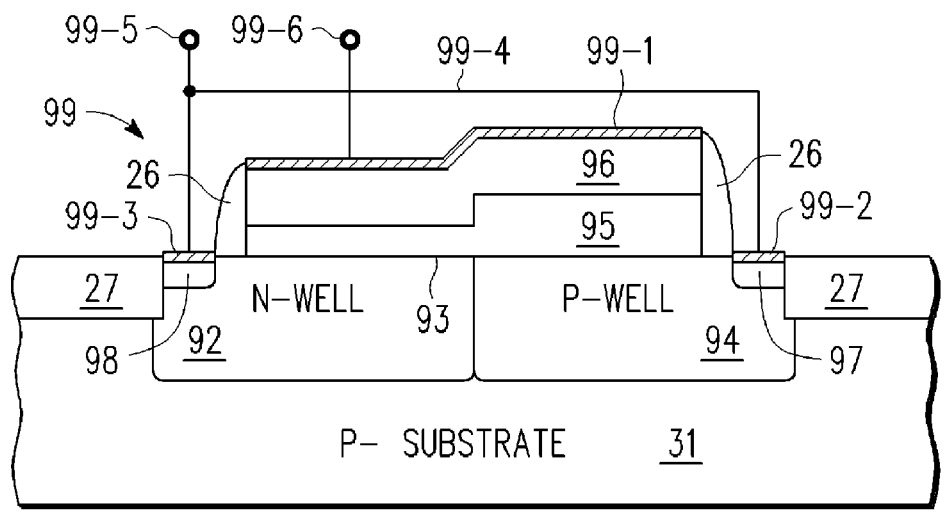
Figure 23:
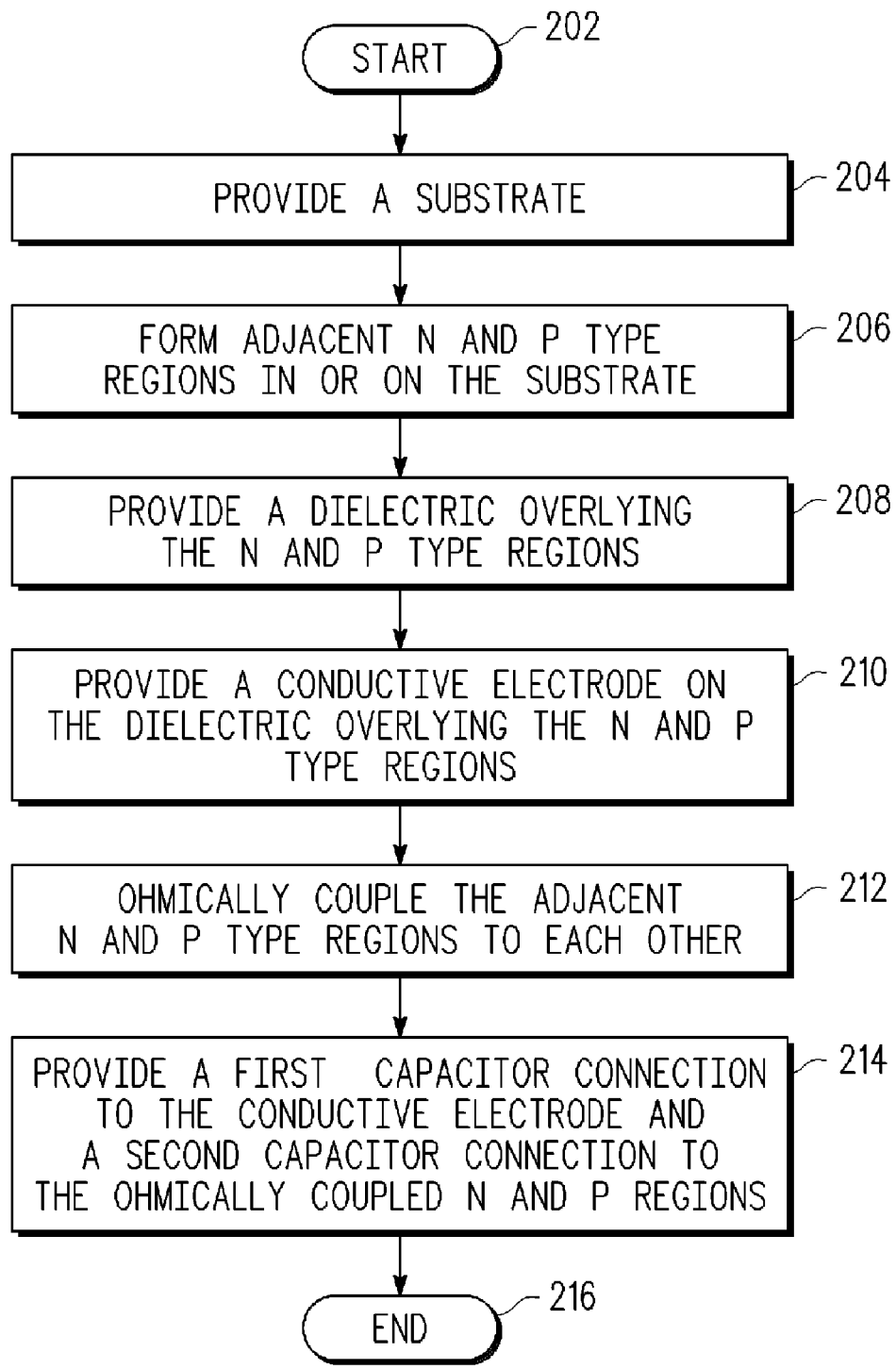
FIG. 23 is a simplified flow chart of a method of forming a MOS CAP, according to a yet further embodiment of the present invention.

FIG. 23 is a simplified flow chart of method 200 of forming a MOS CAP, including those of the type illustrated in FIGS. 2 and 4-6 and others, according to a yet further embodiment of the present invention. Method 200 begins with start 202 and initial PROVIDE A SUBSTRATE step 204. The substrate may be a semiconductor substrate in which N and P type regions may be formed or another type of substrate on which N and P type semiconductor regions maybe formed. Sapphire is a non-limiting example of another type of suitable substrate widely used for forming MOS type ICs. Other types of dielectric isolation substrates may also be used. In step 206, FORM ADJACENT N AND P TYPE REGIONS IN OR ON THE SUBSTRATE, semiconductor regions of N and P doping are formed, as for example, by ion implantation into a SC substrate or by deposition or epitaxial growth on a non-SC substrate, or semi-insulating or intrinsic SC substrate or a combination thereof. These N and P type regions are analogous to N and P-wells 32, 34 and 54, 56 and 92, 94 described earlier and in a preferred embodiment are adjacent as illustrated in FIGS. 2 and 4-8. As used herein, the word "adjacent" is intended to include the "side-by-side" arrangement of FIG. 2 as well as the "laterally-enclosed" arrangement of FIGS. 4-8. N and P-wells (or regions) 32, 34 and 54, 56 and 92, 94 are shown as touching, but that is not essential. Having them touching or interleaved minimizes the total occupied area, which is usually the desirable situation. The earlier discussion about the relative doping of these N and P type regions applies here as well. In PROVIDE A DIELECTRIC OVERLYING THE N AND P TYPE REGIONS step 208, a dielectric layer analogous to dielectric layer 35, 57, 95 is formed, for example, by thermal or electrolytic oxidation or deposition. In PROVIDE A CONDUCTIVE ELECTRODE ON DIELECTRIC OVERLYING THE N AND P TYPE REGIONS step 210, a layer analogous to conductive layer 36, 58, 96 is formed overlying the dielectric layer. In OHMICALLY COUPLE THE ADJACENT N AND P TYPE REGIONS TO EACH OTHER step 212, is accomplished, for example, by contacts 34-1, 32-1 and lead 38 in FIG. 2, contacts 56-1 and 54-1 and lead 61 of FIGS. 4, 6 and 7, contacts 56-1 and 54-1 and silicide 61-1 of FIG. 8, and contact regions 97, 98 and lead 99-4 of FIG. 22. In PROVIDE A FIRST CAPACITOR CONNECTION TO THE CONDUCTIVE ELECTRODE AND A SECOND CAPACITOR CONNECTION TO THE OHMICALLY COUPLED N AND P REGIONS step 214, an electrode analogous to 39-2 of FIGS. 2 and 60-2 of FIGS. 4-8 and 99-6 of FIG. 22 is provided to the conductive electrode (e.g., electrode 36, 58, 96, 99-1), and an electrode analogous to 39-1 of FIG. 2, 60-1 of FIGS. 4-8 and 99-5 of FIG. 22 is provided to the ohmically coupled N and P regions, as for example, regions 32, 34 of FIG. 2, 54, 56 of FIGS. 4-8 and 92, 94 of FIG. 22. Method 200 then proceeds to END 216 or whatever post processing steps may be desired to form the remainder of the IC in which the MOS CAP is being used.

According to a first embodiment, there is provided an MOS capacitor comprising, a substrate having a principal surface, Ohmically coupled N and P semiconductor regions in or on the principal surface, a dielectric layer overlying the N and P regions, and a conductive electrode on the dielectric layer above the N and P regions. According to another embodiment, the dielectric layer has a first portion between the P region and the conductive electrode of a first capacitance per unit area and a second portion between the N region and the conductive electrode of a second capacitance per unit area, and wherein the first and second capacitances per unit area are different. According to a still another embodiment, the first and second capacitances per unit area are different at least in part by differences in relative dielectric constant of the first and second portions. According to a yet another embodiment, the first and second capacitances per unit area are different at least in part by differences in relative thickness of the first and second portions. According to a still yet another embodiment, the P region underlying a first portion of the dielectric layer and a first portion of the conductive electrode has a first dopant concentration $C_P$, and the N region underlying a second portion of the dielectric layer and a second portion of the conductive electrode has a second dopant concentration $C_N$ not equal to $C_P$. According to a yet still another embodiment, the first portion of the dielectric layer has a thickness $DT_P$ and the second portion of the dielectric layer has a thickness $DT_N$ and for $C_N > C_P$, then $DT_P > DT_N$ and for $C_N < C_P$, then $DT_P < DT_N$. According to a further embodiment, the first portion of the dielectric layer has a thickness $DT_P$ and the second portion of the dielectric layer has a thickness $DT_N$ and wherein the P region of dopant concentration $C_P$ has a first area $A_P$ underlying the conductive electrode and the N region of dopant concentration $C_N$ has a second area $A_N$ underlying the conductive electrode, and for $C_N > C_P$, then $DT_P > DT_N$ and $A_P > A_N$, and for $C_N < C_P$, then $DT_P < DT_N$ and $A_P < A_N$. According to a still further embodiment, the P region has a dopant concentration $C_P$ and a first area $A_P$ underlying the conductive electrode, and the N region has a dopant concentration $C_N$ and a second area $A_N$ underlying the conductive electrode, and for $C_N > C_P$, then $A_P > A_N$, and for $C_N < C_P$, then $A_P < A_N$. According to a yet further embodiment, the P region has a dopant concentration $C_P$ and a first area $A_P$ underlying the conductive electrode, and the N region has a dopant concentration $C_N$ and a second area $A_N$ underlying the conductive electrode, wherein for $C_N \neq C_P$, an area ratio $A_P/A_N$ for the N and P regions is determined based in part on a ratio $[(CAPmax)_N]/[(CAPmax)_P]$, where $(CAP max)_N$ is a maximal value of a capacitance versus voltage curve obtained using an N-type region and where $(CAP max)_P$ is a maximal value of a capacitance versus applied voltage curve obtained using a P-type region, wherein a ratio CAPmax/CAPmin for the N-region and the P-region are substantially equal.

According to a second embodiment, there is provided a method for forming an MOS capacitor having first and second electrodes, comprising, providing a substrate having a principal surface, forming a first semiconductor region of a first conductivity type in or on the principal surface, forming a second semiconductor region of a second conductivity type opposite the first conductivity type in or on the principal surface, providing a dielectric layer overlying the first and second regions, forming a conductive layer on the dielectric layer over the first and second regions, thereby providing the first electrode of the capacitor, and Ohmically coupling the first and second semiconductor regions, thereby providing the second electrode of the capacitor. According to another embodiment, the steps of forming the first and second semiconductor regions further comprise, forming the first semiconductor region of the first conductivity type of a first dopant concentration $C_1$, and forming the second semiconductor region of the second conductivity type of a second dopant concentration $C_2$ smaller than the first dopant concentration $C_1$. According to a still another embodiment, the step of providing a dielectric layer, comprises, forming a dielectric layer having a first thickness over the first semiconductor region and a second thickness over the second semiconductor region, wherein the second thicknesses exceeds the first thickness. According to a yet another embodiment, the steps of forming the first and second semiconductor regions further comprise, forming the first semiconductor region of the first conductivity type of a first dopant concentration $C_1$ and of a first lateral area $A_1$ under the conductive layer, and forming the second semiconductor region of the second conductivity type of a second dopant concentration $C_2$ smaller than the first dopant concentration $C_1$ and of a second lateral area $A_2$ under the conductive layer larger than the first lateral area $A_1$. According to a yet still another embodiment, the step of providing a dielectric layer comprises, forming a dielectric layer having a first thickness over the first semiconductor region and a second thickness over the second semiconductor region, wherein the second thicknesses exceeds the first thickness. According to a still yet another embodiment, the second semiconductor region has a dopant concentration $C_2$ and area $A_2$ underlying the conductive electrode, and the first semiconductor region has a dopant concentration $C_1$ and area $A_1$ underlying the conductive electrode, wherein for $C_1 \neq C_2$, an area ratio $A_2/A_1$ for the first and second semiconductor regions is determined based in part on a ratio $[(CAPmax)_1]/[(CAPmax)_2]$, where $(CAP\ max)_1$ is a maximal value of a capacitance versus applied voltage curve obtained using a semiconductor region of the first conductivity type and where $(CAP\ max)_2$ is a maximal value of a capacitance versus applied voltage curve obtained using a semiconductor region of the second conductivity type, wherein a ratio $[CAPmax/CAPmin]_1$ for the first semiconductor region and a ratio $[CAPmax/CAPmin]_2$ for the second semiconductor region are substantially equal and CAPmin is a minimum value of the capacitance versus voltage curve.

According to a third embodiment, there is provided a method for forming an MOS capacitor, comprising, providing a substrate, forming adjacent N and P type semiconductor regions in or on the substrate, providing a dielectric overlying the N and P type semiconductor regions, providing a conductive electrode on the dielectric overlying the N and P type semiconductor regions, Ohmically coupling the adjacent N and P type semiconductor regions to each other, and providing a first capacitor connection to the conductive electrode and a second capacitor connection to the Ohmically coupled N and P semiconductor regions. According to another embodiment, the step of forming adjacent N and P semiconductor regions, comprises, implanting the N semiconductor region to a first dopant concentration $C_N$, implanting the P semiconductor region to a second dopant concentration $C_P$, and wherein $C_N$ and $C_P$ have a relative concentration ratio $C_N/C_P$. According to a still another embodiment, the step of providing a dielectric, comprises, forming a dielectric of thickness $DT_N$ over the N semiconductor region, forming a dielectric of thickness $DT_P$ over the P semiconductor region, and wherein $DT_N$ and $DT_P$ have a relative thickness ratio $DT_N/DT_P \neq 1$. According to a yet another embodiment, for $C_N/C_P > 1$, then $DT_N/DT_P < 1$. According to still yet another embodiment, the step of forming adjacent N and P semiconductor regions, comprises, implanting the N semiconductor region to a first dopant concentration $C_N$ and lateral area $A_N$, implanting the P semiconductor region to a second dopant concentration $C_P$ and lateral area $A_P$, wherein $C_N$ and $C_P$ have a relative concentration ratio $C_N/C_P$, and $A_N$ and $A_P$ have a relative area ratio $A_N/A_P$, and for $C_N/C_P > 1$, then $A_N/A_P < 1$, and for $C_N/C_P < 1$, then $A_N/A_P > 1$.

While at least one exemplary embodiment has been presented in the foregoing detailed description, it should be appreciated that a vast number of variations exist, especially with respect to choices of substrate 31, dielectric layer 35, 57, 95 contacts, conductors and interconnections 36, 58, 61-1, 96 and 99. It should also be appreciated that the exemplary embodiment are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for forming an MOS capacitor having first and second electrodes, comprising:
    providing a substrate having a principal surface;
    forming a first semiconductor region of a first conductivity type in or on the principal surface;
    forming a second semiconductor region of a second conductivity type opposite the first conductivity type in or on the principal surface, wherein the second semiconductor region laterally surrounds the first semiconductor region;
    providing a dielectric layer overlying the first and second regions;
    forming a conductive layer on the dielectric layer over the first and second regions, thereby providing the first electrode of the capacitor; and
    Ohmically coupling the first and second semiconductor regions, thereby providing the second electrode of the capacitor.

2. The method of claim 1, wherein the steps of forming the first and second semiconductor regions further comprise:
    forming the first semiconductor region of the first conductivity type of a first dopant concentration $C_1$; and
    forming the second semiconductor region of the second conductivity type of a second dopant concentration $C_2$ smaller than the first dopant concentration $C_1$.

3. The method of claim 2, wherein the step of providing a dielectric layer, comprises, forming a dielectric layer having a first thickness over the first semiconductor region and a second thickness over the second semiconductor region, wherein the second thicknesses exceeds the first thickness.

4. The method of claim 1, wherein the steps of forming the first and second semiconductor regions further comprise:
    forming the first semiconductor region of the first conductivity type of a first dopant concentration $C_1$ and of a first lateral area $A_1$ under the conductive layer; and
    forming the second semiconductor region of the second conductivity type of a second dopant concentration $C_2$ smaller than the first dopant concentration $C_1$ and of a second lateral area $A_2$ under the conductive layer larger than the first lateral area $A_1$.

5. The method of claim 4, wherein the step of providing a dielectric layer comprises, forming a dielectric layer having a first thickness over the first semiconductor region and a second thickness over the second semiconductor region, wherein the second thicknesses exceeds the first thickness.

6. The method of claim 5, wherein the second semiconductor region has a dopant concentration $C_2$ and area $A_2$ underlying the conductive electrode, and the first semiconductor region has a dopant concentration $C_1$ and area $A_1$ underlying the conductive electrode, wherein for $C_1 \neq C_2$, an area ratio $A_2/A_1$ for the first and second semiconductor regions is determined based in part on a ratio $[(CAPmax)_1]/[(CAPmax)_2]$, where $(CAP\ max)_1$ is a maximal value of a capacitance versus applied voltage curve obtained using a semiconductor region of the first conductivity type and where $(CAP\ max)_2$ is a maximal value of a capacitance versus applied voltage curve obtained using a semiconductor region of the second conductivity type, wherein a ratio $[CAPmax/CAPmin]_1$ for the first semiconductor region and a ratio $[CAPmax/CAPmin]_2$ for the second semiconductor region are substantially equal and CAPmin is a minimum value of the capacitance versus voltage curve.

7. A method for forming an MOS capacitor, comprising:
    providing a substrate;
    forming adjacent N and P type semiconductor regions in or on the substrate, wherein one of the N and P type semiconductor regions laterally surrounds another of the N and P type semiconductor regions;
    providing a dielectric overlying the N and P type semiconductor regions;
    providing a conductive electrode on the dielectric overlying the N and P type semiconductor regions;

Ohmically coupling the adjacent N and P type semiconductor regions to each other; and providing a first capacitor connection to the conductive electrode and a second capacitor connection to the Ohmically coupled N and P semiconductor regions.

8. The method of claim 7, wherein the step of forming adjacent N and P semiconductor regions, comprises:

implanting the N semiconductor region to a first dopant concentration $C_N$;

implanting the P semiconductor region to a second dopant concentration $C_P$; and wherein $C_N$ and $C_P$ have a relative concentration ratio $C_N/C_P$.

9. The method of claim 8, wherein the step of providing a dielectric, comprises:

forming a dielectric of thickness $DT_N$ over the N semiconductor region;

forming a dielectric of thickness $DT_P$ over the P semiconductor region, and wherein $DT_N$ and $DT_P$ have a relative thickness ratio $DT_N/DT_P \neq 1$.

10. The method of claim 9, wherein for $C_N/C_P > 1$, then $DT_N/DT_P < 1$.

11. The method of claim 7, wherein the step of forming adjacent N and P semiconductor regions, comprises:

implanting the N semiconductor region to a first dopant concentration $C_N$ and lateral area $A_N$;

implanting the P semiconductor region to a second dopant concentration $C_P$ and lateral area $A_P$;

wherein $C_N$ and $C_P$ have a relative concentration ratio $C_N/C_P$, and $A_N$ and $A_P$ have a relative area ratio $A_N/A_P$; and for $C_N/C_P > 1$, then $A_N/A_P < 1$, and for $C_N/C_P < 1$, then $A_N/A_P > 1$.

12. A method for forming an MOS capacitor, comprising:

providing a substrate having a principal surface;

forming N and P semiconductor regions in or on the principal surface, wherein one of the N and P type semiconductor regions laterally surrounds another of the N and P type semiconductor regions;

forming a dielectric layer overlying the N and P semiconductor regions;

forming a conductive electrode on the dielectric layer above the N and P regions; and Ohmically coupling the N and P semiconductor regions.

13. The method of claim 12, wherein the dielectric layer has a first portion between the P region and the conductive electrode of a first capacitance per unit area and a second portion between the N region and the conductive electrode of a second capacitance per unit area, and wherein the first and second capacitances per unit area are different.

14. The method of claim 13, wherein the first and second capacitances per unit area are different at least in part by differences in relative dielectric constant of the first and second portions.

15. The method of claim 13, wherein the first and second capacitances per unit area are different at least in part by differences in relative thickness of the first and second portions.

16. The method of claim 12, wherein the P region underlying a first portion of the dielectric layer and a first portion of the conductive electrode has a first dopant concentration $C_P$, and the N region underlying a second portion of the dielectric layer and a second portion of the conductive electrode has a second dopant concentration $C_N$ not equal to $C_P$.

17. The method of claim 16, wherein the first portion of the dielectric layer has a thickness $DT_P$ and the second portion of the dielectric layer has a thickness $DT_N$ and for $C_N > C_P$, then $DT_P > DT_N$ and for $C_N < C_P$, then $DT_P < DT_N$.

18. The method of claim 16, wherein the first portion of the dielectric layer has a thickness $DT_P$ and the second portion of the dielectric layer has a thickness $DT_N$ and wherein the P region of dopant concentration $C_P$ has a first area $A_P$ underlying the conductive electrode and the N region of dopant concentration $C_N$ has a second area $A_N$ underlying the conductive electrode, and for $C_N > C_P$, then $DT_P > DT_N$ and $A_P > A_N$, and for $C_N < C_P$, then $DT_P < DT_N$ and $A_P < A_N$.

19. The method of claim 12, wherein the P region has a dopant concentration $C_P$ and a first area $A_P$ underlying the conductive electrode, and the N region has a dopant concentration $C_N$ and a second area $A_N$ underlying the conductive electrode, and for $C_N > C_P$, then $A_P > A_N$, and for $C_N < C_P$, then $A_P < A_N$.

20. The method of claim 12, wherein the P region has a dopant concentration $C_P$ and a first area $A_P$ underlying the conductive electrode, and the N region has a dopant concentration $C_N$ and a second area $A_N$ underlying the conductive electrode, wherein for $C_N \neq C_P$, an area ratio $A_P/A_N$ for the N and P regions is determined based in part on a ratio $[(CAPmax)_N]/[(CAPmax)_P]$, where $(CAP\,max)_N$ is a maximal value of a capacitance versus voltage curve obtained using an N-type region and where $(CAP\,max)_P$ is a maximal value of a capacitance versus applied voltage curve obtained using a P-type region, wherein a ratio CAPmax/CAPmin for the N-region and the P-region are substantially equal.

* * * * *